US 6,614,102 B1

(12) United States Patent
Hoffman et al.

(10) Patent No.: US 6,614,102 B1
(45) Date of Patent: Sep. 2, 2003

(54) SHIELDED SEMICONDUCTOR LEADFRAME PACKAGE

(75) Inventors: Paul Hoffman, Chandler, AZ (US); Doug Mathews, Gilbert, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/848,864

(22) Filed: May 4, 2001

(51) Int. Cl.[7] .............................................. H01L 23/552
(52) U.S. Cl. ..................... 257/666; 257/659; 257/660
(58) Field of Search ................... 257/666, 667, 257/659, 660

(56) References Cited

U.S. PATENT DOCUMENTS

| 4,814,943 A | 3/1989 | Okuaki ..................... 361/400 |
| 4,935,803 A | 6/1990 | Kalfus et al. ................ 357/68 |
| 5,166,772 A | 11/1992 | Soldner et al. ............ 257/659 |

(List continued on next page.)

FOREIGN PATENT DOCUMENTS

| JP | 61029158 | 2/1986 | ........... H01L/23/12 |
| JP | 63-128736 | 6/1988 | ........... H01L/23/04 |
| JP | 6326218 | 11/1994 | ........... H01L/23/28 |
| JP | 10214923 | 8/1998 | ........... H01L/21/56 |

OTHER PUBLICATIONS

U.S. patent application Ser. No. 09/848,932, Hoffman et al., filed May 4, 2001.

Primary Examiner—Michael S. Lebentritt
Assistant Examiner—Brad Smith
(74) Attorney, Agent, or Firm—Bever, Hoffman & Harms, LLP; James E. Parsons

(57) ABSTRACT

A semiconductor chip package includes a plurality of leadframe portions and a semiconductor die mounted on at least one of the leadframe portions. A shield element is attached to at least one of the leadframe portions. A package mold surrounds the semiconductor die and the shield element. Radiation shielding is thereby provided in a practical manner for a leadframe-based semiconductor chip package.

40 Claims, 7 Drawing Sheets

U.S. PATENT DOCUMENTS

| | | | |
|---|---|---|---|
| 5,200,809 A | 4/1993 | Kwon | 257/707 |
| 5,235,131 A | 8/1993 | Mueller et al. | 174/35 R |
| 5,309,321 A | 5/1994 | Olla et al. | 361/714 |
| 5,365,107 A | 11/1994 | Kuraishi et al. | 257/673 |
| 5,371,404 A | 12/1994 | Juskey et al. | 257/659 |
| 5,436,203 A | 7/1995 | Lin | 437/209 |
| 5,521,429 A | 5/1996 | Aono et al. | 257/676 |
| 5,530,202 A | 6/1996 | Dais et al. | 174/35 R |
| 5,547,730 A | 8/1996 | Weiblen et al. | 428/76 |
| 5,639,989 A | 6/1997 | Higgins, III | 174/35 |
| 5,650,659 A * | 7/1997 | Mostafazadeh et al. | 257/660 |
| 5,656,857 A | 8/1997 | Kishita | 257/690 |
| 5,656,864 A | 8/1997 | Mitsue et al. | 257/787 |
| 5,668,406 A | 9/1997 | Egawa | 257/690 |
| 5,677,511 A | 10/1997 | Taylor et al. | 174/52.2 |
| 5,703,398 A | 12/1997 | Sono et al. | 257/706 |
| 5,805,427 A | 9/1998 | Hoffman | 361/770 |
| 5,851,337 A | 12/1998 | Chen | 156/275.3 |
| 5,894,108 A | 4/1999 | Mostafazadeh et al. | 174/52.4 |
| 5,909,057 A | 6/1999 | McCormick et al. | 257/704 |
| 5,939,784 A | 8/1999 | Glenn | 257/710 |
| 5,965,843 A | 10/1999 | Schönberger et al. | 174/35 |
| 5,973,263 A | 10/1999 | Tuttle et al. | 174/52.2 |
| 5,977,613 A | 11/1999 | Takata et al. | 257/666 |
| 5,977,630 A | 11/1999 | Woodworth et al. | 257/712 |
| 5,981,043 A | 11/1999 | Murakami et al. | 428/209 |
| 6,092,281 A | 7/2000 | Glenn | 29/841 |
| 6,130,115 A | 10/2000 | Okumura et al. | 438/124 |
| 6,130,473 A | 10/2000 | Mostafazadeh et al. | 257/666 |
| 6,143,981 A | 11/2000 | Glenn | 174/52.4 |
| 6,195,267 B1 | 2/2001 | MacDonald, Jr. et al. | 361/800 |
| 6,198,171 B1 | 3/2001 | Huang et al. | 257/787 |
| 6,225,146 B1 | 5/2001 | Yamaguchi et al. | 438/123 |
| 6,229,200 B1 | 5/2001 | Mclellan et al. | 257/666 |
| 6,246,115 B1 | 6/2001 | Tang et al. | 257/706 |
| 6,281,568 B1 | 8/2001 | Glenn et al. | 257/684 |
| 6,392,309 B1 | 5/2002 | Wataya et al. | 257/796 |
| 6,429,044 B1 * | 8/2002 | Tuttle | 438/106 |
| 6,429,512 B1 | 8/2002 | Huang et al. | 257/706 |
| 6,433,420 B1 | 8/2002 | Yang et al. | 257/712 |
| 2001/0034076 A1 * | 10/2001 | Martin | 438/50 |

* cited by examiner

SHIELDED SEMICONDUCTOR LEADFRAME PACKAGE

TECHNICAL FIELD OF THE INVENTION

The present invention relates to semiconductor chip packages, and in particular to a radiation-shielded semiconductor leadframe package and a method for making the same.

BACKGROUND OF THE INVENTION

Leadframe-based semiconductor chip packages are known. In particular, packages that have leads and a die pad exposed on the bottom surface are known. Some of the challenges of forming such packages, while ensuring that the leads and die pad remain locked to the package mold, are addressed in co-pending U.S. patent application, Ser. No. 09/395,875, entitled "Plastic Integrated Circuit Device Package and Micro-Leadframe and Method for Making the Package," U.S. patent application, Ser. No. 09/393,016, entitled "Plastic Integrated Circuit Package and Method and Leadframe for Making the Package," and in U.S. patent application, Ser. No. 09/439,917, entitled "Cavity Semiconductor Package With Exposed Leads and Die Pad and Method for Making the Same," all of which are incorporated by reference herein in their entirety.

In some applications, it is desirable to shield an integrated circuit chip from electromagnetic interference. Shielding external to the package is costly and impractical, particularly when the package has exposed leads and an exposed die pad. Incorporation of shielding into packages has remained problematic on a commercial scale.

SUMMARY OF THE INVENTION

Therefore, a need has arisen for a semiconductor chip package and packaging method that meets these challenges. In particular, a need has arisen for a shielded, leadframe-based semiconductor chip package, and a method for making the same.

Accordingly, a semiconductor chip package is disclosed. In one embodiment, the package includes a plurality of leadframe portions and a semiconductor die mounted on at least one of the leadframe portions. A shield element is attached to at least one of the leadframe portions. A package mold surrounds the semiconductor die and the shield element.

A method for assembling a semiconductor chip package is also disclosed. In one embodiment, the method includes providing a leadframe comprising a plurality of leads, mounting a semiconductor die on the leadframe, mounting an electromagnetic interference shield on the leadframe, and encapsulating at least a portion of the leadframe and the semiconductor die with a mold material to form a package mold.

An advantage of the present invention is that radiation shielding is provided in a practical manner for a leadframe-based semiconductor chip package.

BRIEF DESCRIPTION OF THE DRAWINGS

For a more complete understanding of the present invention and for further features and advantages, reference is now made to the following description taken in conjunction with the accompanying drawings, in which.

DETAILED DESCRIPTION OF EXEMPLARY EMBODIMENTS

The exemplary embodiments of the present invention and their advantages are best understood by referring to FIGS. 1 through 11 of the drawings. Like numerals are used for like and corresponding parts of the various drawings.

Figure 1:
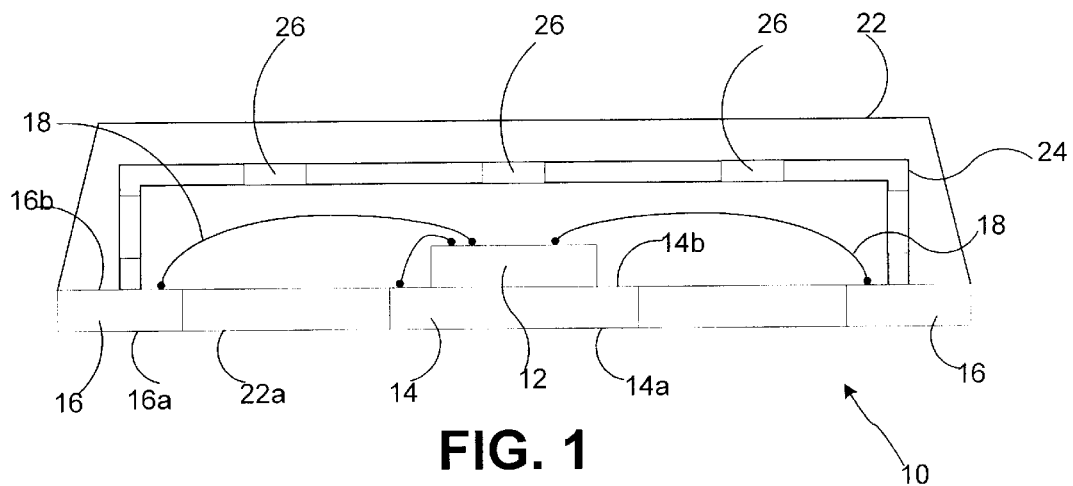
FIG. 1 is a vertical cross section of a semiconductor chip package constructed in accordance with the present invention.
Figure 2:
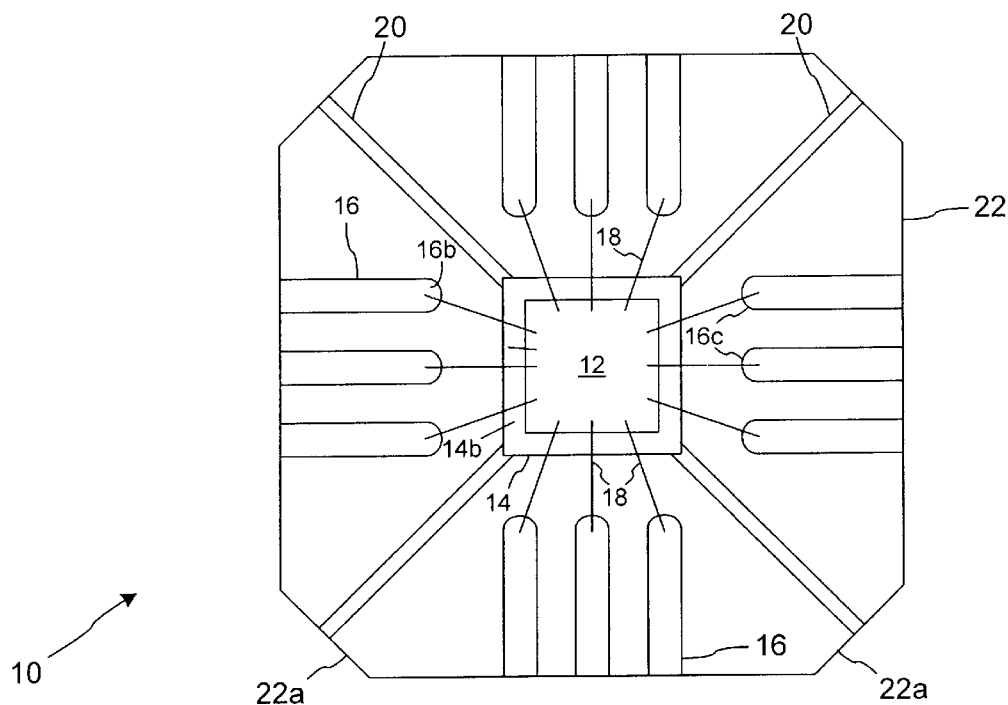
FIG. 2 is a floor plan view of the package.

FIG. 1 is a vertical cross section of a semiconductor chip package 10 constructed in accordance with the present invention. FIG. 2 is a floor plan view of package 10. Reference may be made to these figures in conjunction with the following description to understand the various components of package 10.

Package 10 represents one embodiment of a shielded, leadframe-based semiconductor chip package. As described below, other leadframe-based packages may also benefit from the electromagnetic shielding described herein.

Package 10 includes a semiconductor die 12 mounted on a die pad 14. A set of leads 16 projects inward from the outer perimeter of package 10 toward die 12 and die pad 14. Bond pads (not shown) on die 12 are electrically connected to respective ones of the leads 16 by bond wires 18. Diagonal support elements 20 (also known as tiebars) support die pad 14 in position prior to the package molding and saw steps of the assembly process, as will be described more fully below.

A package mold 22 provides structural support for package 10. Package mold 22 may be formed from any one of a variety of commercially available mold compounds such as epoxidized ortho cresol novolac (EOCN), biphenyl (BP), dicyclopentadiene (DCPD) and multifunctional (MF) compounds available from a variety of manufacturers. Package mold 22 has a generally square outline as shown in FIG. 2, with chamfered corners 22a. While chamfered corners 22a are not necessary to practice the present invention, they may help to reduce the mechanical stress caused by a thermal expansion mismatch between the leadframe material and the mold compound. Chamfered corners 22a may be formed by the shape of the mold used to form package mold 22. When packages such as package 10 are to be formed in large quantities, as described below, it may be more efficient to create square corners on package 10 rather than chamfered corners 22a.

Die pad 14 and leads 16 have bottom surfaces 14a and 16a, respectively, that are substantially coplanar with the bottom surface 22a of package mold 22. Thus, the bottom surfaces 14a and 16a of die pad 14 and leads 16, respectively, are exposed at the bottom surface 22a of package mold 22 so that electrical and/or thermal contact may be made with die pad 14 and leads 16.

Because leads 16 are exposed along the bottom surface 22a of package mold 22, leads 16 are susceptible to breaking free from the adhesion of package mold 22, which can result in one or more leads 16 projecting downward from the bottom surface 22a of package mold 22 or even breaking free from package 10 altogether, causing an open circuit. It is, of course, desirable to keep leads 16 in a planar arrangement and fixed to package mold 22. Thus, leads 16 may have tabs which are effective in preventing leads 16 from breaking free from package mold 22. These tabs are described in the aforementioned U.S. patent application, Ser. No. 09/439,917, incorporated by reference.

Other known mechanisms may also be used to lock leads 16 and die pad 14 in place. These known mechanisms include etching or coining portions of die pad 14 and leads 16, and are described in the aforementioned U.S. patent applications, Ser. Nos. 09/395,875 and 09/393,016, which have been incorporated herein by reference. Accordingly, these methods will not be described further herein.

Package 10 includes a shield element 24 which shields semiconductor die 12 from electromagnetic interference. Shield element 24 may be made from any suitable metal, such as copper, nickel, chrome, stainless steel or other alloys, and may be plated with other metals to enhance corrosion resistance, improve solderability, or add to electrical shielding efficiency. For example, shield element 24 may be plated with gold, tin lead, indium, palladium, platinum and/or alloys of these or other metals. Shield element 24 is connected to selected leads 16, and is grounded to provide an effective electromagnetic interference shield.

Figure 3:
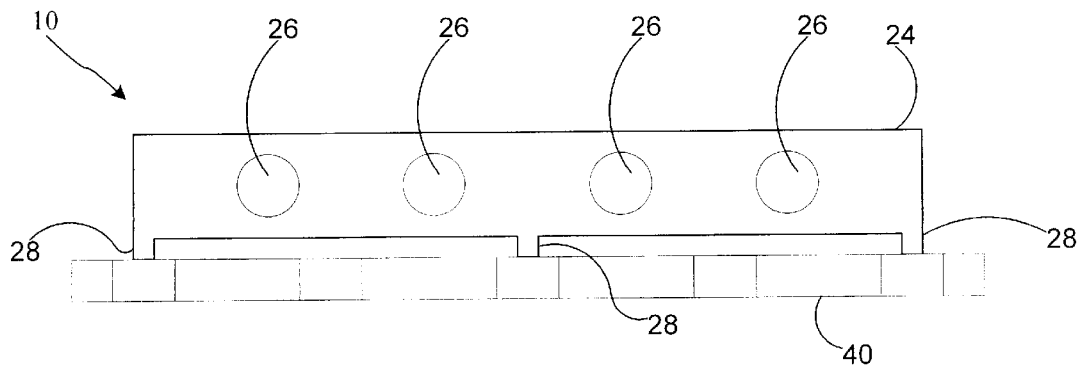
FIG. 3 is a front view of the package during assembly.
Figure 4:
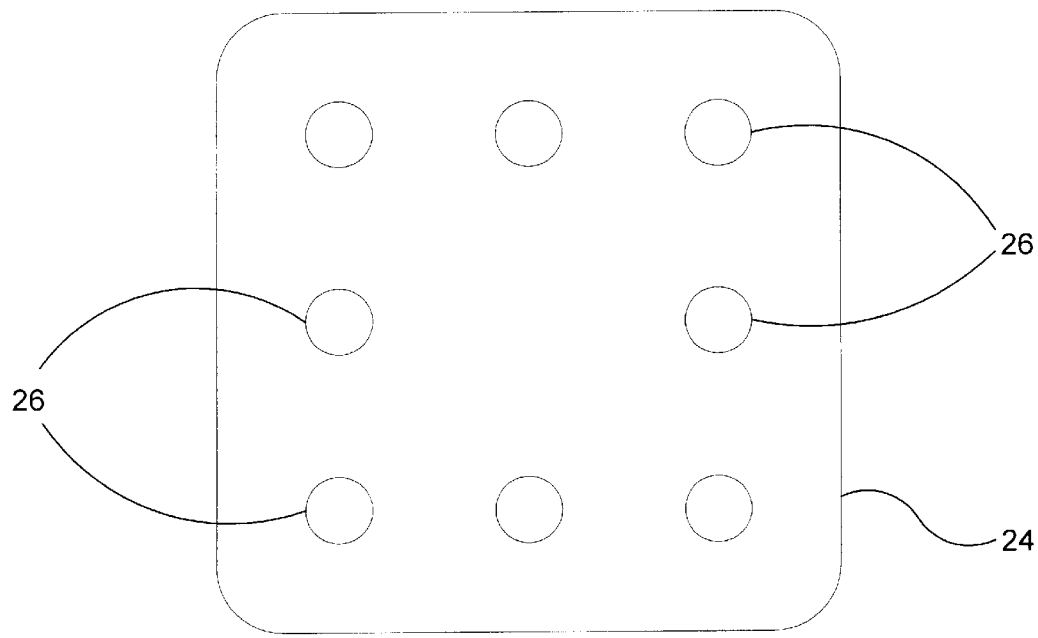
FIG. 4 is a top view of a shield element used in the package.

FIG. 3 is a front view of package 10 during assembly, prior to the formation of package mold 22. FIG. 4 is a top view of shield element 24. Holes 26 are formed in the top and sides of shield element 24. Holes 26 allow mold compound to reach the interior of shield element 24 during formation of package mold 22.

Holes 26 are appropriately sized relative to the wavelength of the radiation from which semiconductor die 12 is to be shielded. For example, holes 26 may have a diameter no greater than one-twelfth the predominant wavelength in the spectrum of electromagnetic interference.

No holes are formed in the central area of the top of shield element 24 (see FIG. 4). This unperforated central area allows a vacuum pick-up head to pick and place shield element 24 during package assembly.

An exemplary set of dimensions for semiconductor chip package 10 are given in Table A. These dimensions are set forth for illustrative purposes only, and in no way represent a limitation on the usefulness of the techniques described herein. A die thickness of 0.004–0.027 inches is assumed.

TABLE A

| | |
|---|---|
| Height of package: | 0.9 mm |
| Width/length of package: | 7 mm |
| Angle of chamfered corners: | 45° |
| Length of package edge between chamfered corners: | 5.181 mm |
| Angle of inclination of package mold sides: | 82° |
| Number of leads: | 12 |
| Lead spacing (center-to-center): | 0.762 mm |
| Lead width: | 0.381 mm |
| Lead/die pad thickness: | 0.004–0.010 in. |
| Width/length of shield: | 4.6 mm |

TABLE A-continued

| | |
|---|---|
| Height of shield: | 0.6–0.7 mm |
| Length/width of die pad: | 1.727 mm |

Figure 5:
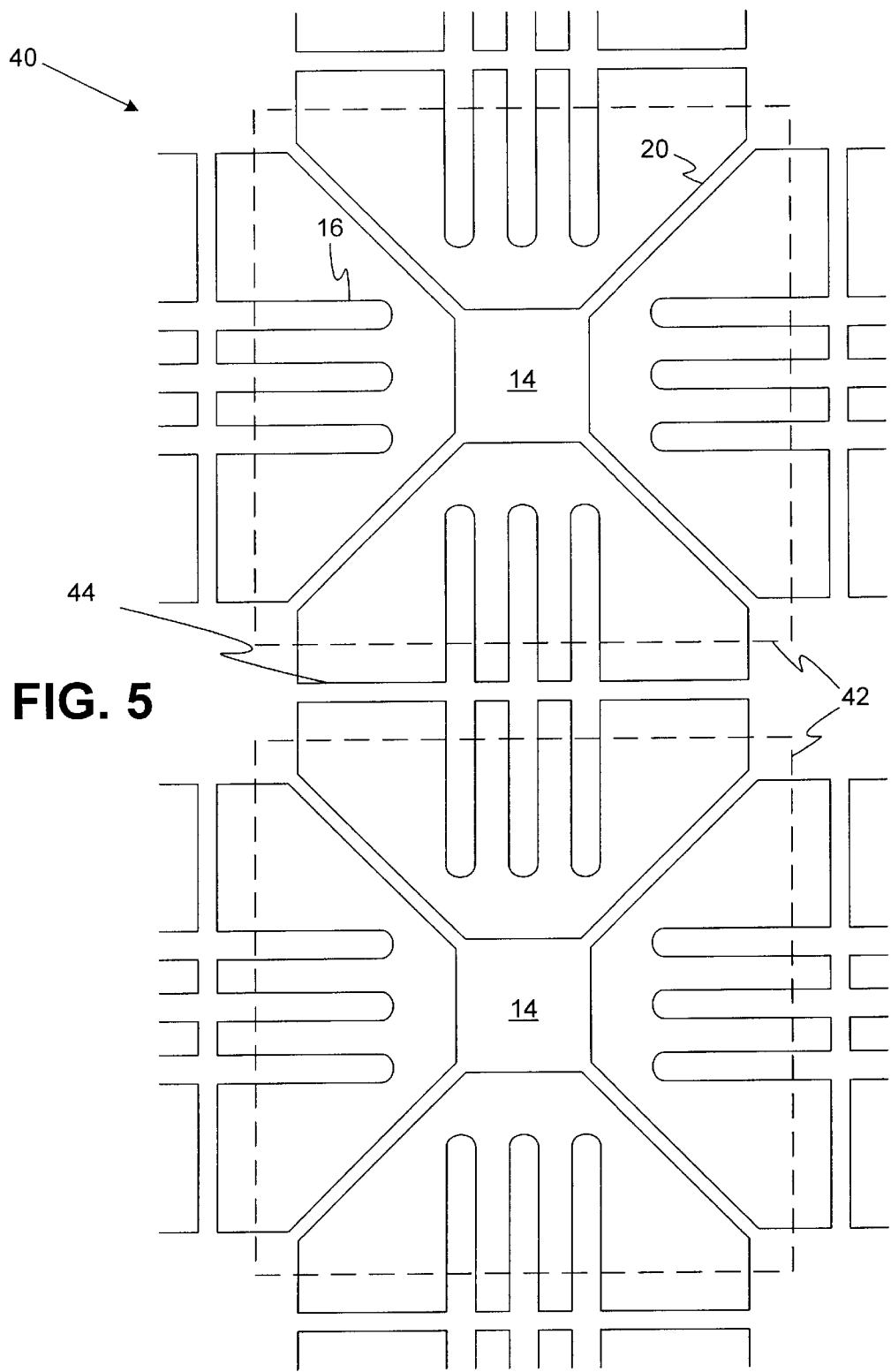
FIG. 5 is a top view of a portion of a leadframe used in the assembly process.

An assembly process for creating packages such as package 10 in quantity will now be described. Referring to FIG. 5, a top view of a portion of a leadframe 40 for use in such an assembly process is shown, with the outline of the final shape of semiconductor chip packages 10 being overlaid in dashed lines 42 for reference. In the first step of the process, leadframe 40 is created. In one embodiment, leadframe 40 is stamped from a single, planar sheet of metal, such as the steel alloy known as "alloy 42," or copper, or copper alloys with or without nickel or palladium plating. After the formation of leadframe 40, any additional modifications such as etching or coining may be carried out, if desired.

Semiconductor dies 12 are then attached to die pad 14 and wire bonds 18 are attached (as shown in FIGS. 1 and 2) using conventional die attach and wire bond procedures. Die 12 may be any conventional type of die. For example, die 12 may be a power MOSFET, a GaAs chip, a surface acoustical wave device, an optical chip (e.g., a camera chip), or an erasable memory chip, among other possibilities.

Figure 6:
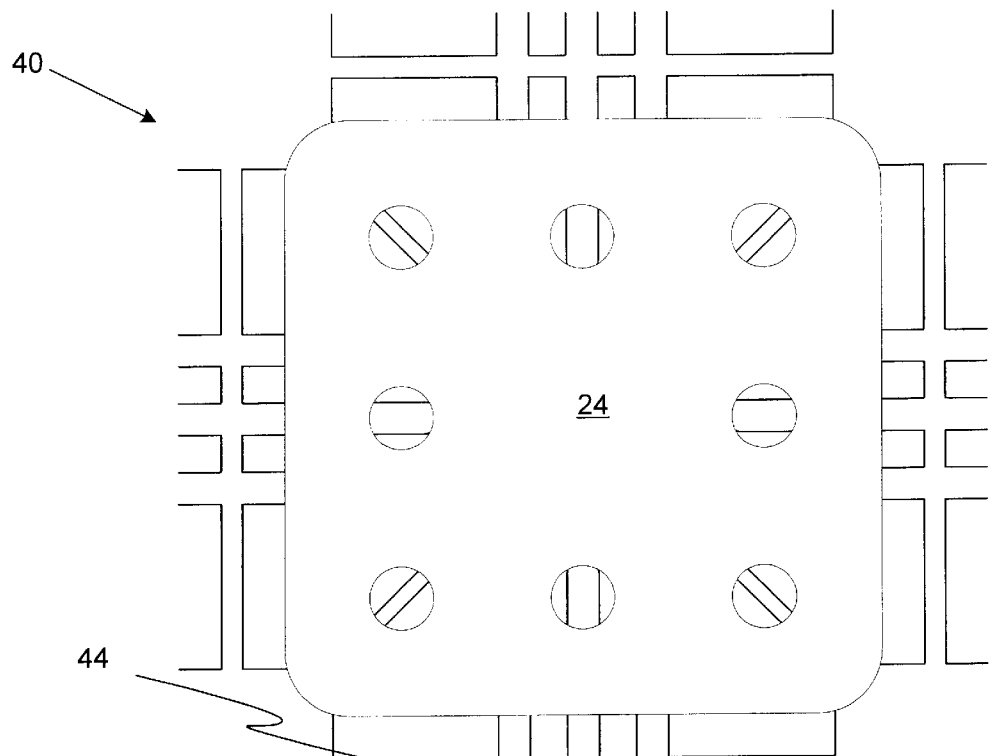
FIG. 6 is a top view of the leadframe and shield element during package assembly.
Figure 6:
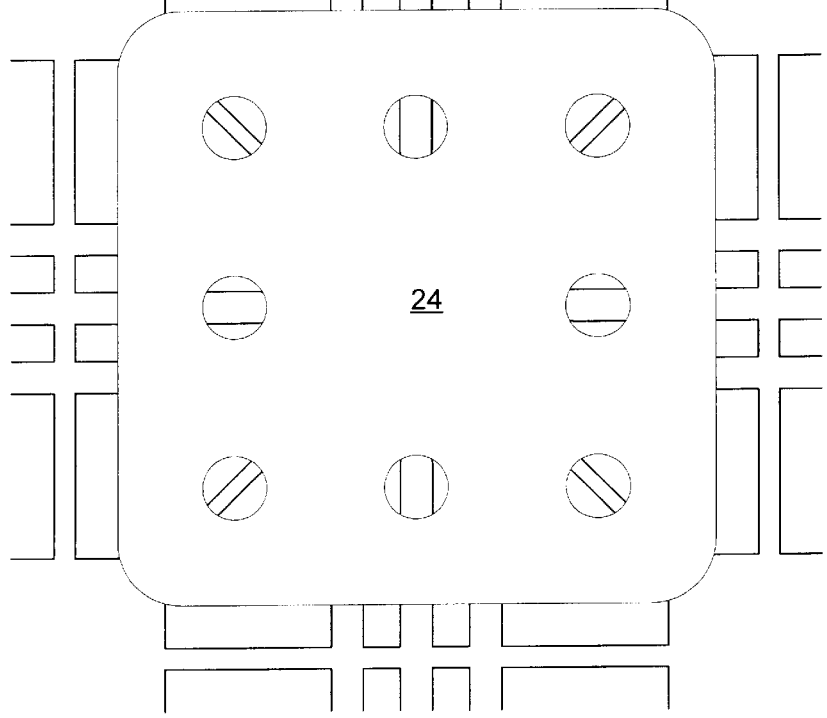

Shield elements 24 are then placed on leadframe 40 as shown in the top view of FIG. 6 and the front view of FIG. 3. Shield element 24 includes legs 28 which contact some of the leads 16 in leadframe 40. The open spaces between legs 28 provide additional apertures for the entry of mold compound into the interior of shield element 24, thereby reduced the required number and/or diameter of holes 26 in shield element 24.

Figure 7:
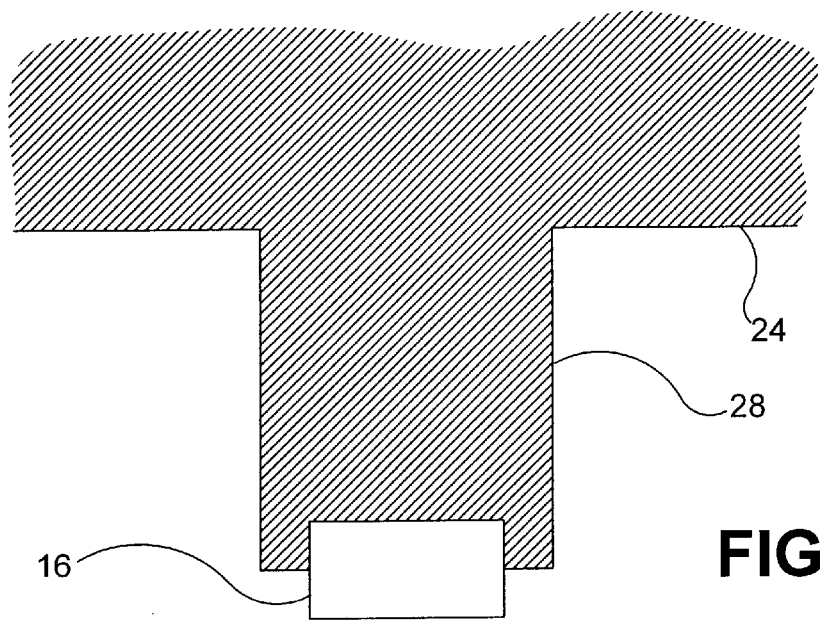
FIGS. 7 and 8 are close-up views of shield element legs.
Figure 8:
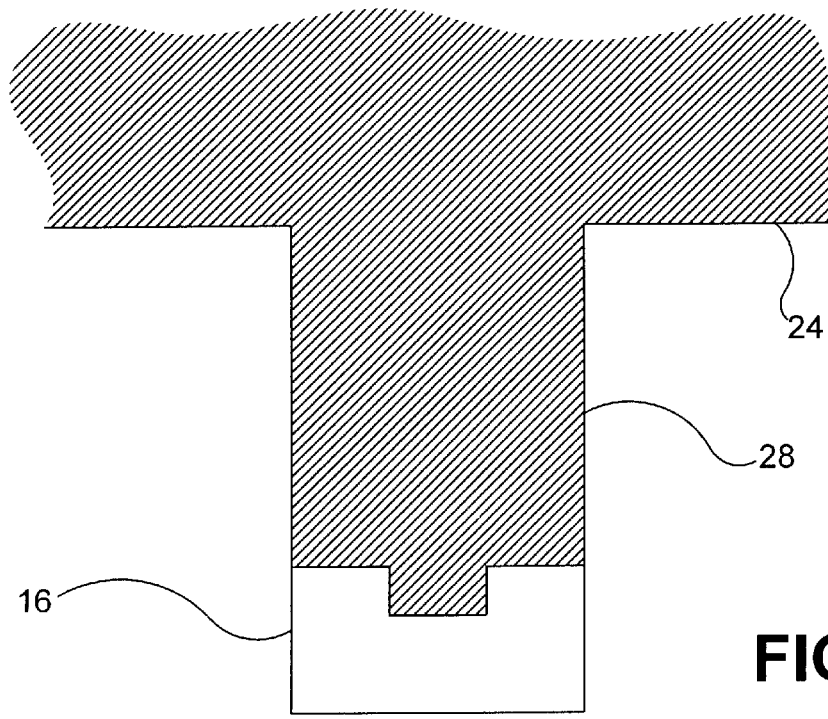
Figure 10:
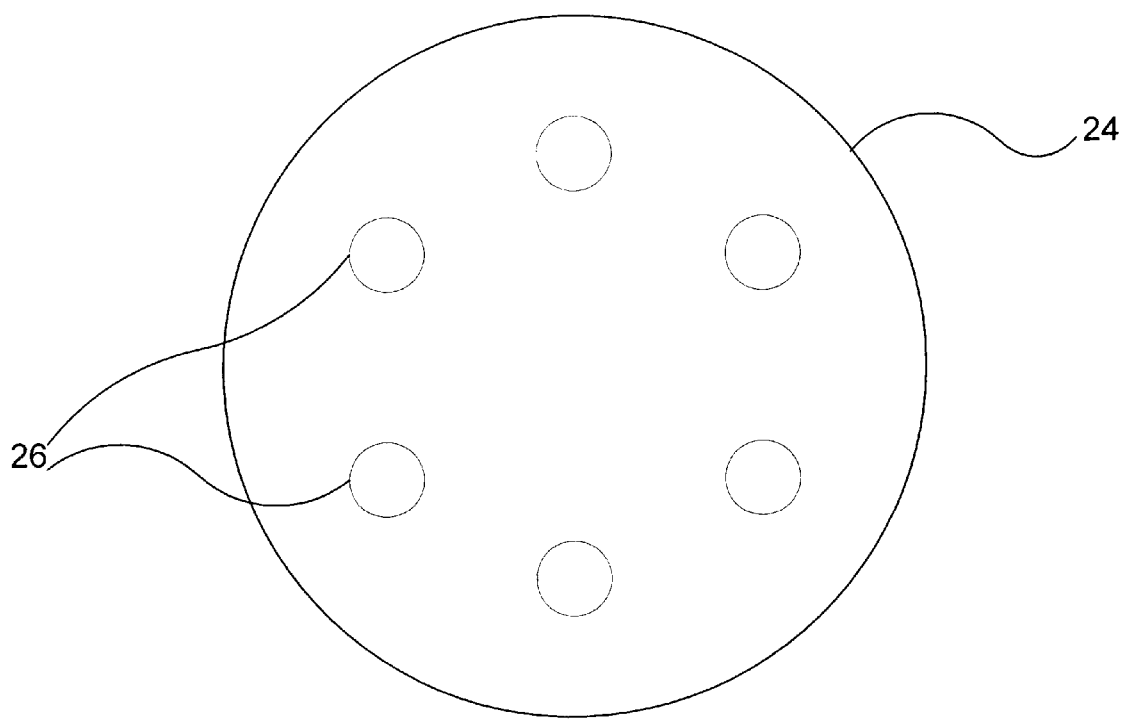
FIG. 10 is a top view of a differently-shaped shield element.

To assist in the alignment of a shield element 24 with leadframe 40, each leg 28 may have a concave lower surface as shown in FIG. 7. The concave lower surface of leg 28 is shaped to receive the upper portion of a lead 16 (shown in cross section in the figure). The same shape of leg 28 may also be used to mate a corner leg 28 with a diagonal support element 20 of the leadframe (shown in FIG. 5). Alternatively, as shown in FIG. 8, leg 28 may have a convex lower surface designed to mate with a corresponding recess in the upper surface of a lead 16 or diagonal support element 20.

Shield elements 24 may be attached to leadframe 40 by means of solder or epoxy in a conventional manner. Mold compound may then be injection-molded around leadframe 40 and shield elements 24 to form an entire array of packages. Conventional molding compounds are used, as described above.

Figure 9:
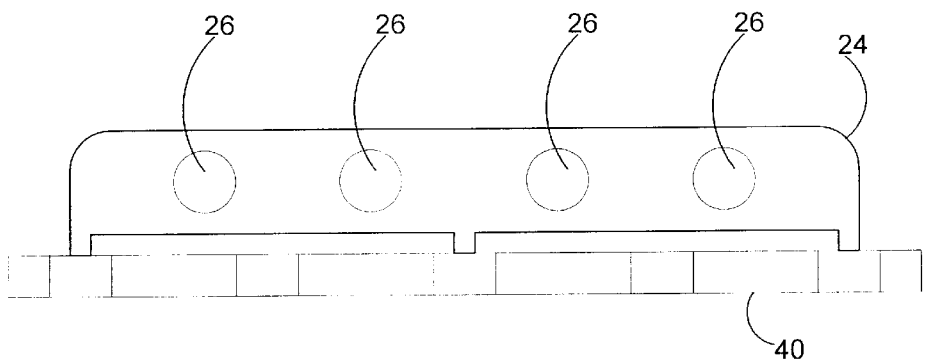
FIG. 9 is a front view of the package during assembly using a differently-shaped shield element.

To reduce the possibility of air pockets remaining inside shield element 24 during injection molding, shield element 24 may have rounded corners as shown in the top view of FIG. 4 and the side view of FIG. 9. Alternatively, shield element 24 may be circular in shape as shown in the top view of FIG. 10. In this case the side view remains substantially the same as that shown in FIG. 9.

After the formation of package mold 22, the semiconductor chip packages 10, shown in outline by dashed lines 42 in FIG. 5, then separated from each other by a sawing, punching, or equivalent cutting process. In one embodiment, the spacing between adjacent packages and the width of the saw blade are such that the region of leadframe material and mold compound between the dashed lines 42, including connecting strip 44, is obliterated in a single pass of the saw blade. A suitable saw process is described in more detail in the aforementioned co-pending U.S. patent applications, Ser. Nos. 09/395,875 and 09/393,016, and will not be described further herein. In this embodiment, each package 10 has square corners as shown by dashed lines 42 rather than chamfered corners 22a as previously illustrated. While additional saw blade passes may be used to create chamfered corners, this may not prove economical for a mass production environment.

The above-described method for creating packages such as package 10 in quantity may be the most efficient method for creating such packages in a mass production environment. However, package 10 may also be individually molded, particularly for small production runs or for testing. In that case, package mold 22 is formed for only one package in the injection molding process. Package mold 22 may therefore be formed in the desired shape, with chamfered corners 22a as previously described.

It will be appreciated that the above-described packaging methods yield a shielded semiconductor package with leads and a die pad at least partially exposed on their lower surfaces. This package may be used in applications where minimization of electromagnetic interference with the operation of the chip is needed.

Figure 11:
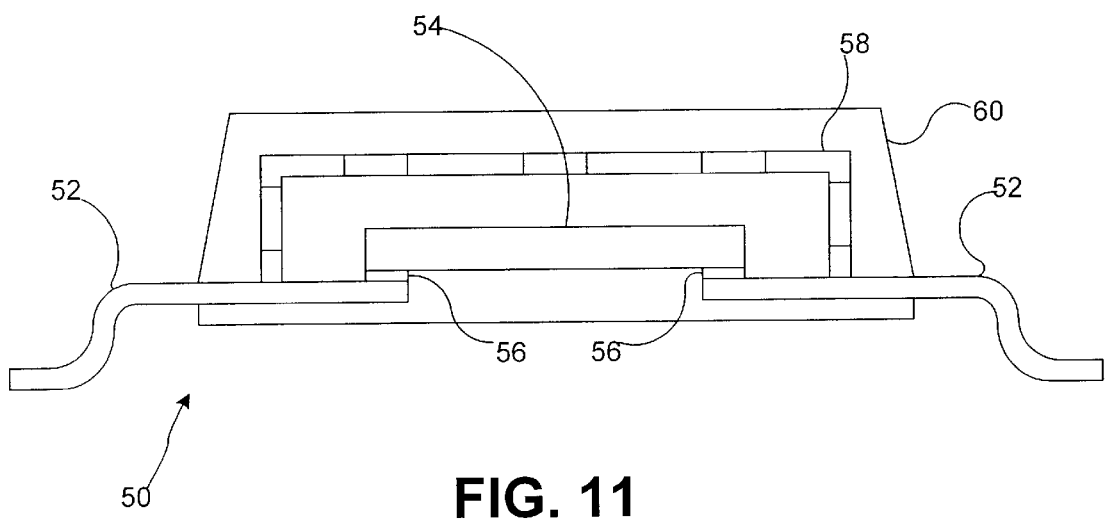
FIG. 11 is a vertical cross section of a flip-chip package constructed in accordance with the present invention

Of course, electromagnetic shielding may be used in various types of leadframe-based packages. Another example of such a package is shown in FIG. 11. In this figure, a flip-chip package 50 is shown in cross section. In package 50, the leadframe consists of gull-wing shaped leads 52. Package 50 has no die pad. Instead, semiconductor die 54 is mounted on leads 52. Bond pads on die 54 are electrically and physically connected to leads 52 by a connection material 56, which may be solder. An electromagnetic shield element 58, similar to those previously described, is attached to selected leads 52, which may establish a ground connection of shield element 58. A package mold 60 is provided around die 54, shield element 58 and the inner portions of leads 52.

The fabrication process for package 50 is very similar to that previously described. A leadframe including leads 52 and connecting portions is provided. Die 54 is then mounted on the leadframe. Shield element 58 is placed on the leadframe in contact with selected leads 52. Shield element 58 may be aligned with the leadframe using the interlocking leg and lead shapes previously described. Shield element 58 may be attached to the leadframe using solder or adhesive. Package mold 60 is then formed around die 54 and shield element 58 using conventional injection molding techniques and materials. A conventional trim-and-form process may then be used to separate leads 52 from the connecting portions of the leadframe and form leads 52 into the gull-wing shape shown in FIG. 11. When package 50 is mounted on a printed circuit board, the printed circuit board may have a ground plane which serves to complete the electromagnetic shielding of die 54.

Although the present invention and its advantages have been described in detail, it should be understood that various changes, substitutions, and alterations can be made therein without departing from the spirit and scope of the invention as defined by the appended claims.

We claim:

1. A semiconductor chip package comprising:
   a plurality of leadframe portions;
   a semiconductor die mounted on at least one of the leadframe portions;
   a shield element attached to at least one of the leadframe portions; and
   a package mold surrounding the semiconductor die and the shield element;
   wherein the leadframe portions comprise a plurality of leads, and wherein a surface of at least one of the leads is exposed at a lower surface of the package mold;
   wherein the leadframe portions further comprise a die pad, and wherein a surface of the die pad is exposed at the lower surface of the package mold.

2. The semiconductor chip package of claim 1, further comprising a bond wire forming an electrical connection between a bond pad on the semiconductor die and one of the leads.

3. The semiconductor chip package according to claim 1, wherein the leadframe portions comprise leads and diagonal members, the diagonal members connected to the die pad, the shield element being attached to at least one of the diagonal members.

4. The semiconductor chip package according to claim 1, wherein the leadframe portions comprise leads and diagonal members, the diagonal members connected to the die pad, the shield element being attached to at least one of the diagonal members and to at least one of the leads.

5. The semiconductor chip package according to claim 1, wherein the shield element further comprises side surfaces adjacent the leadframe portions, the side surfaces having a plurality of holes formed therein.

6. The semiconductor chip package according to claim 1, wherein the shield element further comprises a plurality of legs with slots formed in the shield element between adjacent legs, the legs being attached to the leadframe portions.

7. The semiconductor chip package according to claim 1, wherein the shield element further comprises a plurality of legs, wherein individual legs have a recess formed therein and individual leadframe portions each include a protrusion engaged in the recess of a leg.

8. The semiconductor chip package according to claim 1, wherein the shield element further comprises a plurality of legs, wherein individual legs have a protrusion formed therein and individual leadframe portions each include a recess, the protrusion of each leg being engaged in the recess of one of the leadframe portions.

9. The semiconductor chip package according to claim 1, wherein the shield element further comprises means for interlocking engagement with at least one of the leadframe portions.

10. The semiconductor chip package according to claim 1, wherein the leadframe portions further comprise means for mating with the shield element.

11. A semiconductor chip package comprising:
    a plurality of leadframe portions;
    a semiconductor die mounted on at least one of the leadframe portions;
    a shield element attached to at least one of the leadframe portions; and
    a package mold surrounding the semiconductor die and the shield element;
    wherein the shield element comprises:
       a substantially planar top surface; and
       a plurality of substantially planar side surfaces, the side surfaces being joined to the top surface and to each other with rounded corners.

12. The semiconductor chip package according to claim 11, wherein the shield element further comprises:
    a plurality of legs attached to the leadframe portions;
    slots formed in the shield element between adjacent legs.

13. The semiconductor chip package according to claim 11, wherein the shield element further comprises a plurality of legs, wherein individual legs have a recess formed therein and individual leadframe portions each include a protrusion engaged in the recess of a leg.

14. The semiconductor chip package according to claim 11, wherein the shield element further comprises a plurality of legs, wherein individual legs have a protrusion formed therein and individual leadframe portions each include a recess, the protrusion of each leg being engaged in the recess of one of the leadframe portions.

15. The semiconductor chip package according to claim 11, wherein the leadframe portions include opposing first and second surfaces, the second surfaces of the leadframe portions being exposed through the mold compound.

16. The semiconductor chip package according to claim 11, wherein the leadframe portions include a die pad, the die pad having first and second surfaces, the second surface of the die pad being exposed through the mold compound.

17. The semiconductor chip package according to claim 11, wherein the leadframe portions include leads and a die pad, the leads having opposing first and second surfaces and the die pad having opposing first and second surfaces, the second surfaces of the leads and the die pad being exposed through the mold compound.

18. A semiconductor chip package comprising:
   a plurality of leadframe portions;
   a semiconductor die mounted on at least one of the leadframe portions;
   a shield element attached to at least one of the leadframe portions; and
   a package mold surrounding the semiconductor die and the shield element;
   wherein the shield element comprises:
      a horizontal top surface; and
      least one vertical side surface, the side surface being joined to the top surface with a rounded corner.

19. The semiconductor chip package of claim 18 wherein the top surface of the shield element is circular in shape.

20. A semiconductor chip package comprising:
   a plurality of leadframe portions;
   a semiconductor die mounted on at least one of the leadframe portions;
   a shield element attached to at least one of the leadframe portions; and
   a package mold surrounding the semiconductor die and the shield element;
   wherein the shield element comprises a plurality of legs attached to a corresponding plurality of the leadframe portions;
   slots formed in the shield element between adjacent legs, the package mold filling the slots.

21. The semiconductor chip package of claim 20 wherein at least one of the legs of the shield element comprises a concave lower surface shaped to receive a corresponding one of the leadframe portions.

22. The semiconductor chip package according to claim 20, wherein the leadframe portions include leads and a die pad, the leads having opposing first and second surfaces and the die pad having opposing first and second surfaces, the second surfaces of the leads and the die pad being exposed through the mold compound.

23. The semiconductor chip package according to claim 20, wherein the leadframe portions include a die pad, the die pad having first and second surfaces, the second surface of the die pad being exposed through the mold compound.

24. The semiconductor chip package according to claim 20, wherein slots are formed in the shield element between adjacent ones of the legs.

25. The semiconductor chip package according to claim 20, wherein individual ones of the legs have a recess formed therein and individual leadframe portions each include a protrusion engaged in the recess of a leg.

26. The semiconductor chip package according to claim 20, wherein individual legs have a protrusion formed therein and individual leadframe portions each include a recess, the protrusion of each leg being engaged in the recess of one of the leadframe portions.

27. A semiconductor chip package comprising:
   a plurality of leadframe portions;
   a semiconductor die mounted on at least one of the leadframe portions;
   a shield element attached to at least one of the leadframe portions; and
   a package mold surrounding the semiconductor die and the shield element;
   wherein the shield element comprises a plurality of legs attached to a corresponding plurality of the leadframe portions;
   wherein at least one the legs of the shield element comprises a convex lower surface, and wherein a corresponding one of the leadframe portions comprises a concave upper surface shaped to receive the convex lower surface of the leg.

28. A semiconductor chip package, comprising:
   a leadframe having a die pad and a plurality of leads, the die pad having first and second surfaces and the leads having first and second surfaces;
   a semiconductor die mounted on the first surface of the die pad and electrically connected to the leads;
   a shield element mounted on the leads;
   a mold compound surrounding the semiconductor die and the shield element, the second surfaces of the leads and the second surface of the die pad being exposed through the mold compound.

29. The semiconductor chip package of claim 28, wherein the shield element comprises:
   a substantially planar top surface; and
   a plurality of substantially planar side surfaces, the side surfaces being joined to the top surface and to each other.

30. The semiconductor chip package of claim 28, wherein a set of holes are formed in the shield element, the mold compound filling the holes.

31. The semiconductor chip package of claim 28, wherein the shield element comprises a plurality of legs attached to a corresponding plurality of the leads.

32. The semiconductor chip package of claim 31 wherein at least one of the legs of the shield element comprises a concave lower surface shaped to receive a corresponding one of the leads.

33. The semiconductor chip package of claim 31 wherein at least one of the legs of the shield element comprises a convex lower surface, and wherein a corresponding one of the leads comprises a concave upper surface shaped to receive the convex lower surface of the leg.

34. The semiconductor chip package of claim 28, wherein the semiconductor die is electrically connected to the die pad.

35. The semiconductor chip package of claim 28, wherein the semiconductor die is electrically connected to the first surface of the leads by a set of bond wires.

36. The semiconductor chip package according to claim 28, wherein the leadframe comprises diagonal members connected to the die pad, the shield element being attached to at least one of the diagonal members and to at least one of the leads.

37. The semiconductor chip package according to claim 28, wherein the shield element further comprises a plurality of legs with slots formed in the shield element between adjacent legs, the legs being attached to the leadframe.

38. The semiconductor chip package according to claim 28, wherein the shield element further comprises a plurality of legs, wherein individual legs have a recess formed therein and individual leads each include a protrusion engaged in the recess of a leg.

39. The semiconductor chip package according to claim 28, wherein the shield element further comprises a plurality of legs, wherein individual legs have a protrusion formed therein and individual leads each include a recess, the protrusion of each leg being engaged in the recess of one of the leads.

40. A semiconductor chip package, comprising:

a leadframe having a set of leads, the leads having first and second surfaces;

a semiconductor die electrically connected to the first surfaces of the leads;

a shield element mounted on and electrically connected to the first surfaces of the leads;

a mold compound surrounding the semiconductor die, the shield element, and inner portions of the leads, wherein outer portions of the leads are exposed and extend from the mold compound;

wherein the semiconductor die is electrically connected to the first surfaces of the leads by a flip-chip connection.

* * * * *